(12) United States Patent
Cheng et al.

(10) Patent No.: US 7,115,934 B2
(45) Date of Patent: Oct. 3, 2006

(54) METHOD AND STRUCTURE FOR ENHANCING TRENCH CAPACITANCE

(75) Inventors: Kangguo Cheng, Beacon, NY (US); Ramachandra Divakaruni, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 69 days.

(21) Appl. No.: 10/708,814

(22) Filed: Mar. 26, 2004

(65) Prior Publication Data
US 2005/0215007 A1    Sep. 29, 2005

(51) Int. Cl.
*H01L 27/108*  (2006.01)
*H01L 29/76*   (2006.01)
*H01L 29/94*   (2006.01)
*H01L 31/119*  (2006.01)

(52) U.S. Cl. ............... 257/301; 257/302; 257/532; 257/534; 257/E21.652

(58) Field of Classification Search ........... 257/301, 257/302, 532, 534
See application file for complete search history.

(56) References Cited

U.S. PATENT DOCUMENTS

| | | | |
|---|---|---|---|
| 4,673,962 A | 6/1987 | Chatterjee et al. | |
| 5,888,864 A | 3/1999 | Koh et al. | |
| 6,200,873 B1* | 3/2001 | Schrems et al. | 438/386 |
| 6,232,171 B1 | 5/2001 | Mei | |
| 6,432,774 B1 | 8/2002 | Heo et al. | |
| 6,583,462 B1 | 6/2003 | Furukawa et al. | |
| 2001/0016398 A1* | 8/2001 | Kudelka et al. | 438/427 |
| 2003/0224605 A1 | 12/2003 | Tews et al. | |

* cited by examiner

*Primary Examiner*—Fernando L. Toledo
(74) *Attorney, Agent, or Firm*—Eric Petraske; Rosa Suazo (57) ABSTRACT

A trench capacitor formed with a bottle etch step has a polygonal cross section produced by forming thermally oxidizing the trench walls with thinner oxide at the corners of the trench, then performing the bottle etch step with the nitride in place, thereby extending the trench walls laterally only outside the corners, so that the distance of closest approach between adjacent trenches is reduced while the length of the perimeter is maintained.

3 Claims, 12 Drawing Sheets

METHOD AND STRUCTURE FOR ENHANCING TRENCH CAPACITANCE

BACKGROUND OF INVENTION

The field of the invention is that of forming trench capacitors in integrated circuits, in particular in DRAM arrays.

Workers in the field of the fabrication of DRAM arrays constantly strive to reduce the amount of area occupied by a memory cell in order to keep up with the constant shrinkage of lithography dimensions.

A technique that has been developed extensively is the fabrication of the storage capacitor in a very deep trench (about 8 microns in current practice) that has been etched into the semiconductor substrate.

The capacitance of a trench capacitor is proportional to the area of the trench walls and therefore to the product of the trench depth and the transverse dimensions.

Shrinking the transverse dimensions is a requirement of reducing the cell area. Increasing the depth becomes extremely difficult, if not impossible, as the trench technology shrinks to 100 nm generation and beyond. Increasing the depth means increasing the process time and increasing process cost.

One known technique in the art is to set the dimensions of the upper portion of the DRAM cells to reflect the need for contacts and bitlines and meanwhile to expand the transverse dimensions of the capacitor itself in the lower portion of the area that, on the surface, is occupied by contacts and other elements of the cell. This lateral expansion is referred to as "bottle etching", since the cross section of the cell resembles a bottle, with the lower portion being wider than the neck.

This process has been carried out to the limit when adjacent cells are in danger of making contact.

Thus, the art needs a method of forming a trench capacitor that maintains a given pitch, while increasing the area of the capacitor formed in the semiconductor substrate.

SUMMARY OF INVENTION

The invention relates to a method of increasing the area of a trench capacitor by etching the walls of the trench while the corners of the trench are blocked.

A feature of the invention is growing thermal oxide on the interior walls such that the oxide is thinner at the corners; etching the oxide to expose semiconductor wall surfaces at the corners; forming nitride on the corners; stripping the oxide; and then etching the trench walls.

Another feature of the invention is etching the trench in two steps, stopping the etch at a collar reference depth, forming a collar, and then continuing the trench etch to the final trench depth.

Another feature of the invention is etching the trench to its final depth, then forming the collar before growing the temporary variable-thickness oxide.

Yet another feature of the invention is etching the trench to its final depth, growing the temporary variable-thickness oxide, exposing the oxide above the collar level, and then growing nitride, so that the collar and the corner nitride are formed simultaneously.

DETAILED DESCRIPTION

Figure 11A:
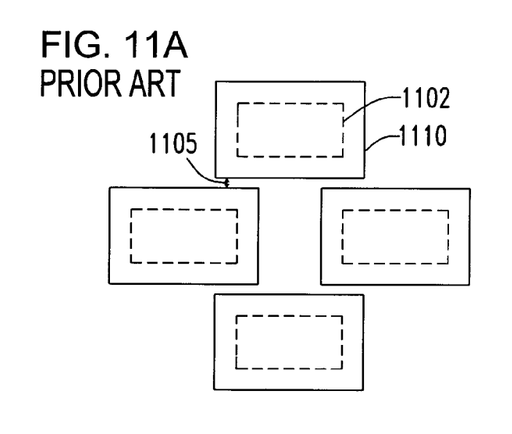
FIGS. 11A and 11B illustrate spatial relationships in a trench array according to prior art and the invention, respectively.

Unknown; Kangguo Cheng; FIG. 11A illustrates a top view of a portion of a DRAM array in a silicon substrate according to the art. Four trenches have been etched into the substrate to hold capacitors for the DRAM cells.

Dashed lines 1102 represent the cross section of the trenches as initially etched. Solid lines 1110 represent the cross section after the "bottle" step in which the interior walls of the lower portion of the trenches are etched laterally in the lower portion, thereby expanding the transverse dimensions of the trench. The problem addressed by the present invention is that the distance of closest approach between trenches 1105 is so small that process fluctuations may cause the trenches to merge.

Figure 11B:
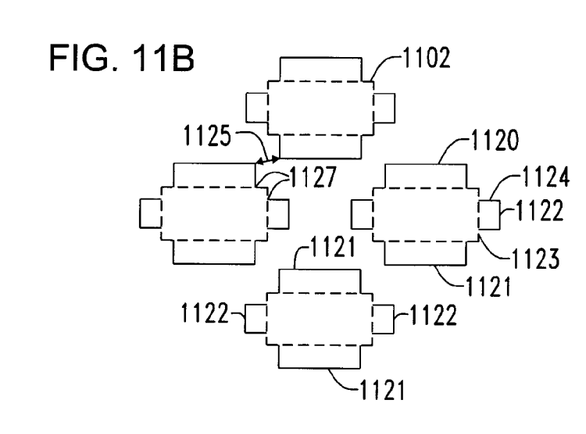

FIG. 11B represents a similar cross section of trenches according to the invention. The same dashed lines 1102 represent the original trench cross section.

Outer polygon 1120 represents the periphery of the trenches after the practice of the invention. As can be seen, the central portions of the main surfaces of the rectangle 1102 have been etched transversely outward from the trench aperture while the corners have not changed in dimension. The resulting shape is a polygon having four main sides 1121, 1122 and four inner projecting corners 1123 separating the main sides. The term "inner projecting corners" refers to corners that are located closer to the center of the polygon than the main sides and have two sides at 270 degrees traveling clockwise, in contrast to the corners 1127 on either side of corners 1123. Eight outer corners 1124 connect the sides 1121 and 1122 with the inner corners 1123. Although the angle difference between consecutive main sides is shown as 90 degrees, it may vary because it depends on the crystallographic structure of the semiconductor substrate and the etching chemistry.

It will be evident by inspection that the perimeter of the polygon is the same as the perimeter of a rectangle based on the four main sides.

A benefit of the invention is that, when the total perimeter distance around the sides of the polygon 1120 is the same as the perimeter of the rectangle 1110, the distance of closest approach 1125 will be greater than the corresponding distance 1105.

Alternatively, if the distance of closest approach is held the same (for the same center to center spacing), the perimeter and thus the capacitance is greater than in the prior art example.

Figure 1:
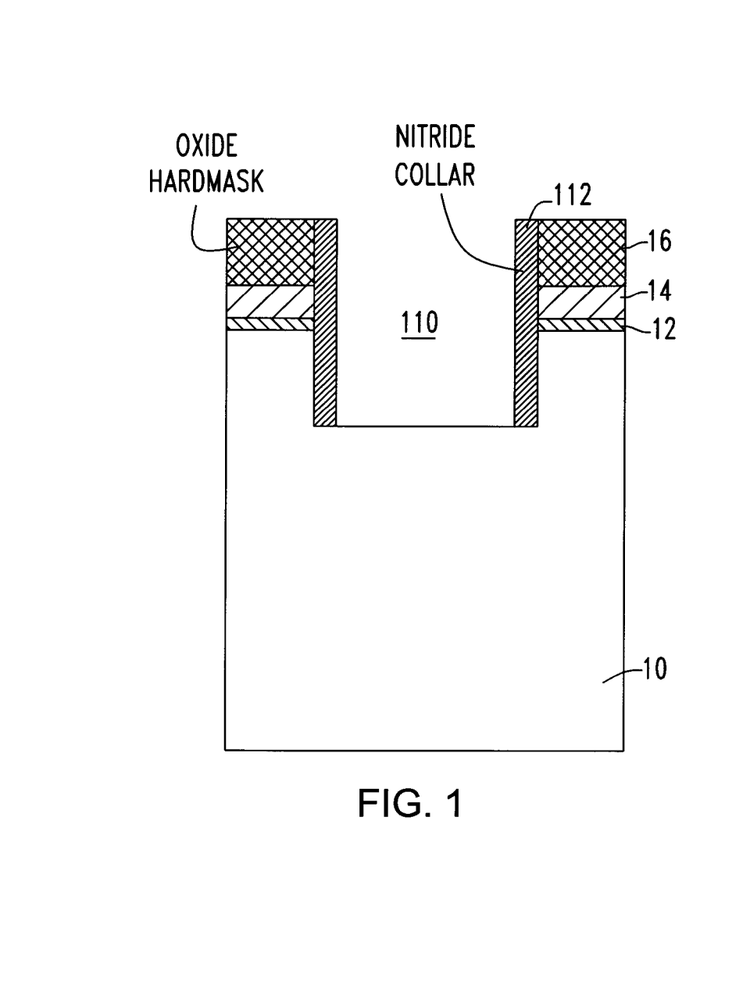
FIGS. 1 through 10 illustrate steps in a first method of practicing the invention.

The process of forming trenches according to the invention is illustrated with respect to a first embodiment in FIGS. 1–10. FIG. 1 shows a cross section of a silicon wafer 10 having pad oxide 12, pad nitride 14 and oxide hardmask 16 formed across the wafer surface. Other semiconductor materials, such as germanium, silicon germanium, gallium arsenic may also be used as the substrate. An aperture 110 has been etched down to an intermediate depth, referred to as the collar reference level. A collar 112, which may be an oxide layer, a nitride layer, or the combination of an oxide layer beneath a nitride layer, has been formed on the interior silicon surfaces (aperture walls) of aperture 110 to protect the silicon surface from the steps involved in performing the bottle etch and capacitor.

Figure 2A:
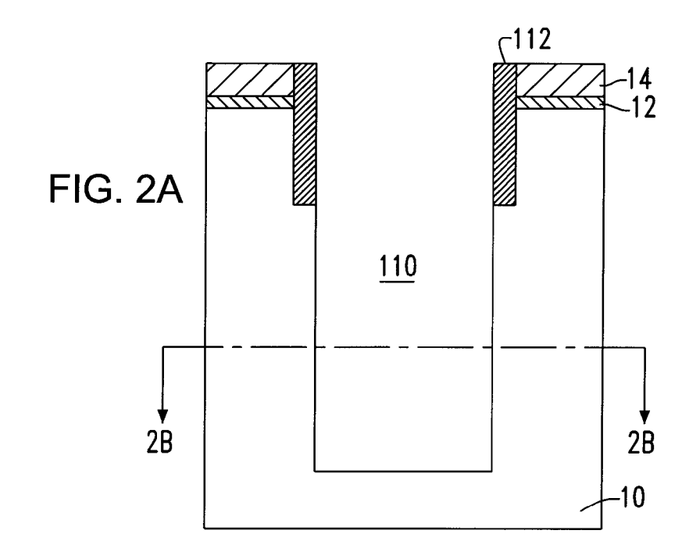
Figure 2B:
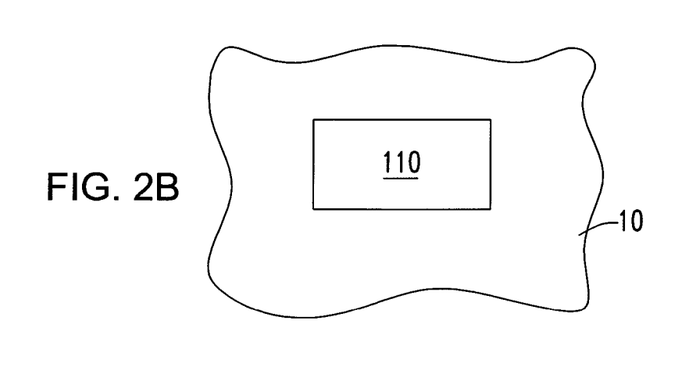

FIG. 2A illustrates the same trench after continuing the etch to extend the aperture 110 down to a final trench depth and stripping the remaining hardmask. FIG. 2B shows a cross section through lines 2B—2B, showing the shape of the trench in the bottle area that will undergo the bottle etch and be formed into the capacitor. Alternatively, the remaining hardmask may also be stripped in later process.

Figure 3A:
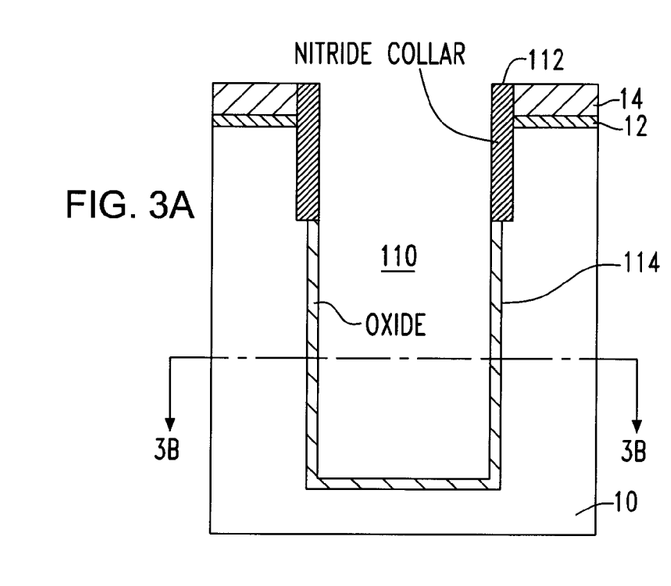

FIG. 3A shows the same area after a step of growing thermal oxide 114 on the walls of the lower bottle portion of the trench.

Figure 3B:
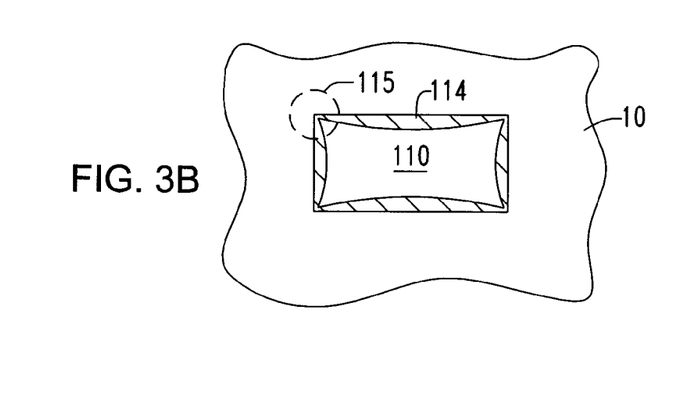

FIG. 3B shows the same cross section as FIG. 2B, with thermal oxide 114 having a maximum thickness in the center and a smaller thickness in corner 115. This change in thickness is the normal result of thermal oxidation and standard processing parameters are used. The oxidation temperature is preferably 700 C 600 C to 1200 C and more preferably 700 C to 900 C.

The thickness of oxide 114 will be set such that the oxide in corners 115 may be easily removed. For example i.e., a timed wet etch will remove oxide to a desired distance from the corners while leaving oxide in the main portion of the wall. In a particular example when the wall length is 200 nm for the long side and 100 nm for the short side, oxide will be removed to a distance of 20 nm from each corner, (referred to as the corner distance).

Figure 4A:
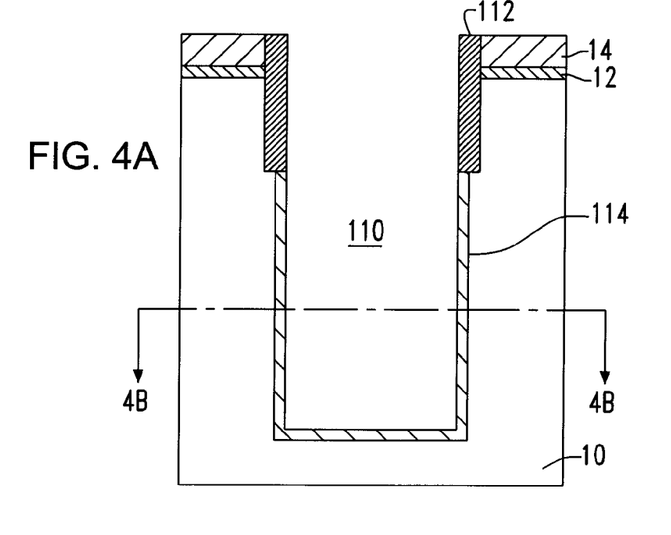
Figure 4B:
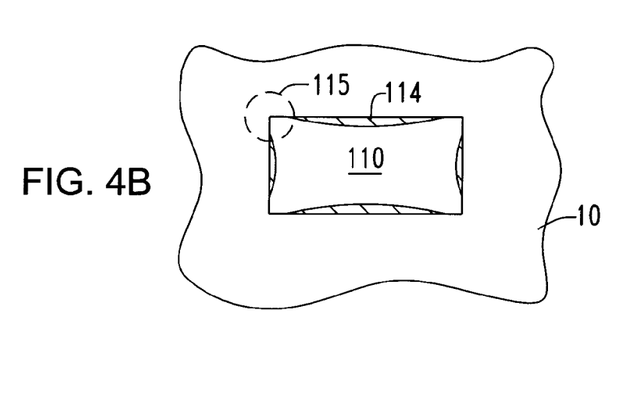

FIG. 4A shows the same cross section as FIG. 3A. FIG. 4B shows that oxide has been removed from corner 115. The corner oxide may be removed by a conventional selective timed wet etch process, such as buffered hydrofluoricHF (BHF) or diluted hydrofluoricHF (DHF). The thickness of the oxide to be removed by etch (referred to as the corner oxide thickness) will be set empirically. This quantity will determine the distance from the corner that the silicon is exposed. After this etch, the remaining oxide will start at zero thickness at the edge of the exposed silicon, rising to a maximum in the center of the trench wall.

Figure 5A:
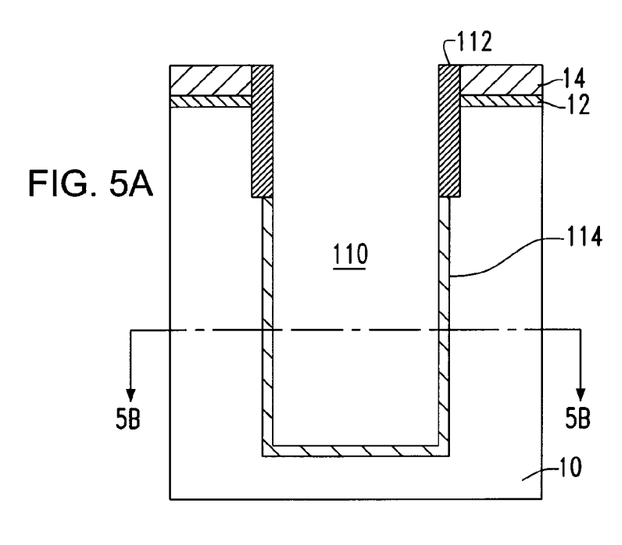
Figure 5B:
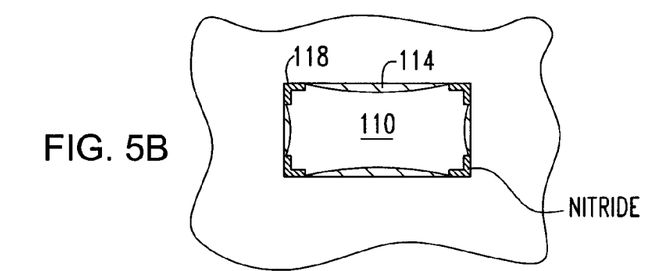

FIG. 5A also shows the same cross section as FIG. 3A. FIG. 5B shows that nitride 118 has been formed in the exposed silicon in the corners 115. The nitride 118 is preferably formed by thermal growth so that the nitride only formed at trench corners where silicon is exposed. Virtually no nitride is grown on the trench walls as they are covered by oxide 114. The nitridation temperature may range from 700 C to 1200 C, preferably from 900 C to 1000 C. The thickness of the nitride formed by thermal nitridation is about 22 Angstroms.

Figure 6A:
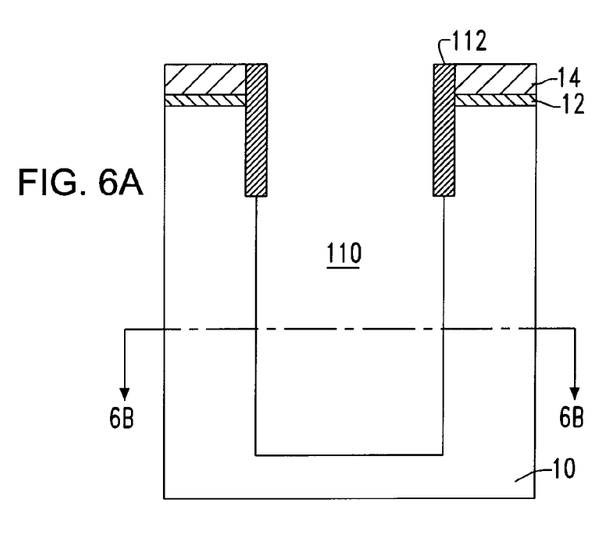
Figure 6B:
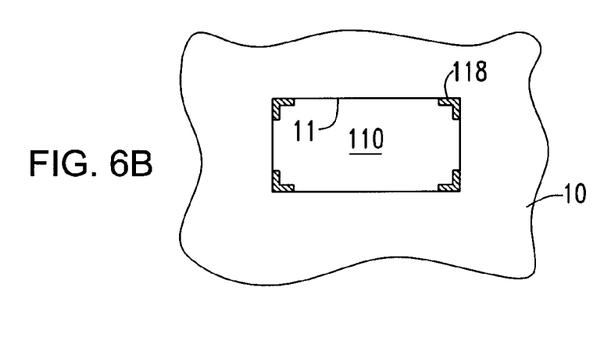

FIG. 6A also shows the same cross section as FIG. 3A. FIG. 6B shows that oxide 114 has been stripped, leaving nitride 118 in the corners 115 and exposed silicon along the aperture walls. The oxide may be stripped by a conventional selective timed wet etch process, such as buffered HF (BHF) or diluted HF (DHF). Alternative, the oxide may be removed by a dry etch process such as plasma etch selective to nitride.

Figure 7A:
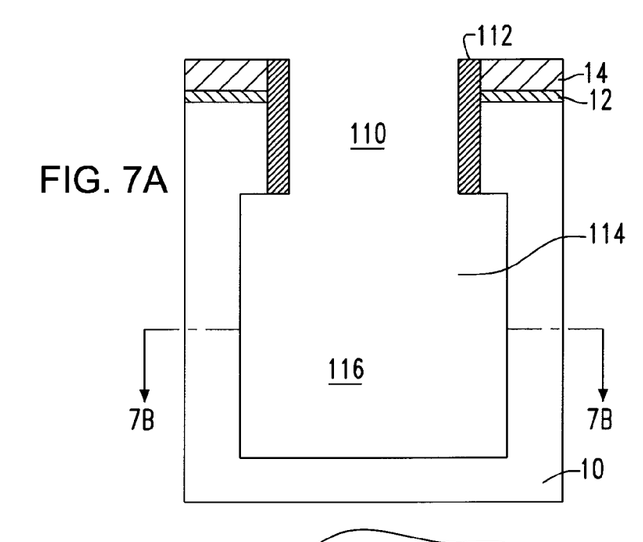

FIG. 7A shows the result of performing the bottle etch by etching the silicon substrate transversely, illustratively with 20 nm, and expanding the lateral dimensions of the trench, thereby extending the trench cross section laterally. The silicon substrate may be etched by using a conventional wet process containing chemistry selective timed etching process, such as an ammonia, ammonia-based etchant (e.g., tetramethyl ammonium hydroxide (TMAH)), or a mixture of nitric and hydrofluoric acid. The nitride prevents corners being etched. Alternative, the silicon substrate may be etched by a dry etch process selective to nitride.

Figure 7B:
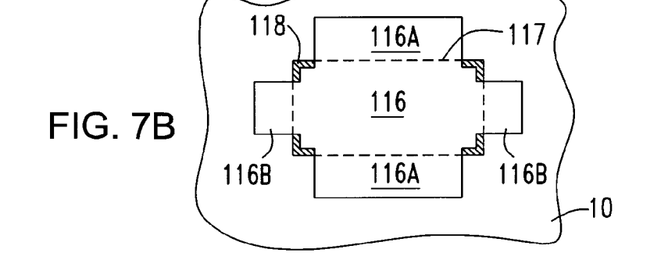

FIG. 7B shows in the cross section the polygon with the same outer corners and inner corners as in FIG. 11B. The original location of the trench walls is indicated with dashed lines 117, the central aperture is denoted with numeral 116 and the four side apertures are denoted with numerals 116A and 116B.

As shown in FIGS. 11A and 11B, a benefit of the invention is that, when the total perimeter distance around the sides of the polygon 1120 is the same as the perimeter of the rectangle 1110, the distance of closest approach 1125 will greater than the corresponding distance 1105.

Figure 8A:
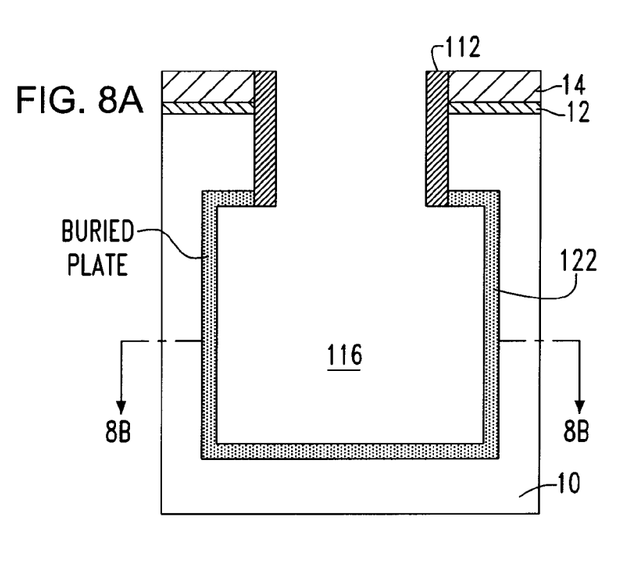
Figure 8B:
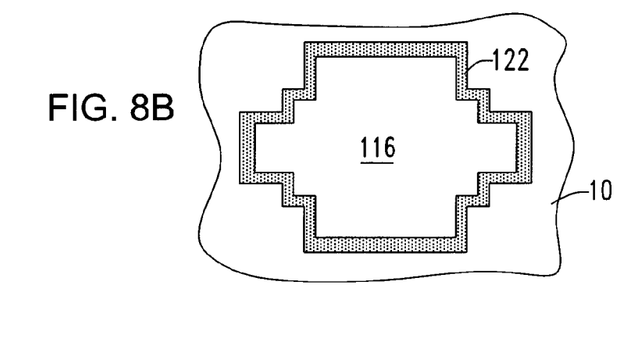

FIG. 8A shows the result of stripping the nitride in the corner and optionally forming an optional buried plate 122 in substrate 10. The nitride may be stripped by using a conventional chemistry containing hydrofluoric/ethylene glycol (HF/EG) or hot phosphoric acid ($H_3PO_4$). A buried plate is a portion of the substrate which is heavily doped. It may be formed by any conventional process, such as gas phase doping, plasma doping, plasma immersion ion implantation, outdiffusion doping from a solid film such as arsenic doped silicate glass, or any combination of these approaches. The presence of the nitride in the corners does not affect the formation of the buried plate because the dopant in the plate diffuses around the nitride 118 in the corners to form a continuous plate. Therefore, the nitride at corners may be alternatively stripped after forming the buried plate or in the subsequent collar removal process. The collar 112 in the upper trench prevents undesired doping in the upper trench. FIG. 8B shows the cross section having the extended perimeter provided by the invention after stripping nitride at the corners.

Figure 9A:
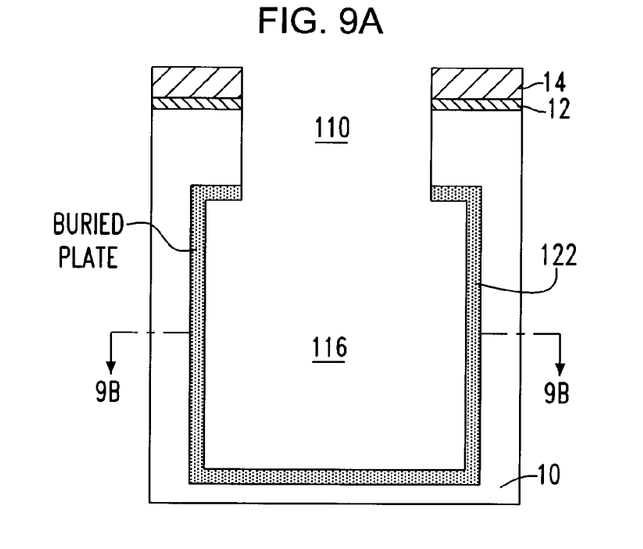
Figure 9B:
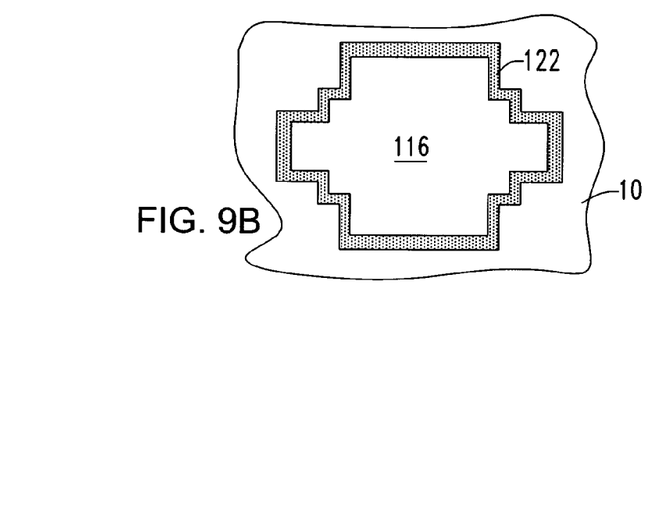

FIGS. 9A and 9B show the result of stripping the collar 112 from the upper trench by any conventional process. If the collar is comprised of oxide, it may be stripped by BHF or DHF. If the collar is comprised of nitride, it may be stripped by HF/EG or hot $H_3PO_4$.

Nitride in corners may be also stripped simultaneously at this step if it hasis not been stripped in the previous process.

Figure 10A:
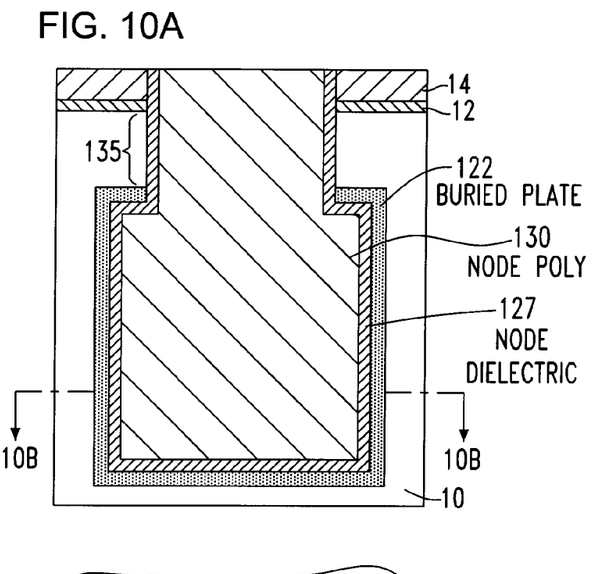
Figure 10B:
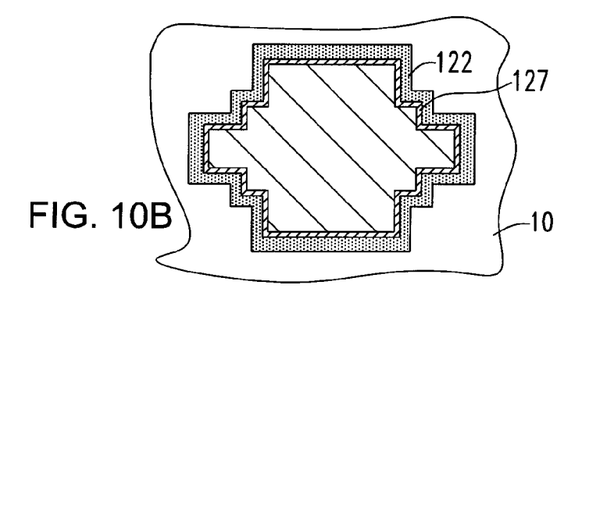

FIGS. 10A and 10B show the result of depositing a node dielectric 127, e.g. nitride, oxide, or oxynitride, and center electrode, e.g. doped polysilicon (poly) 130. Other suitable materials may also be used as node dielectric 127 and the center electrode 130.

The capacitor is now complete and may be connected to other circuit elements. For example, one application of a capacitor according to the invention is in a DRAM cell, in which case, the cell pass transistor will be formed connecting the capacitor to the bitline. Bracket 135 represents schematically a vertical NMOS transistor formed by conventional techniques to complete a DRAM cell.

The process illustrated above may be summarized as: Forming pad oxide and pad nitride Depositing and patterning a hardmask such as oxide Etching a partial trench Forming a collar Completing the trench etch to form the final deep trench Stripping the hardmask Growing thermal oxide, thinner at the trench corners Etching oxide to expose silicon at trench corners, leaving oxide in the center Forming nitride in the corners Stripping remaining oxide Etching the exposed silicon in the center of trench walls Stripping nitride in the corners Forming buried plate (optional) Stripping collar Forming node dielectric Filling the trench with center electrode Alternatively, the nitride in the corners may be stripped after forming the buried plate.

FIGS. 12–18 illustrate an alternative embodiment of the invention, in which the trench is etched in a single step and the collar is formed after etching the trench. This embodiment of the invention has the advantage compared with the first embodiment that the deep trench is formed by a single etch process.

Figure 12A:
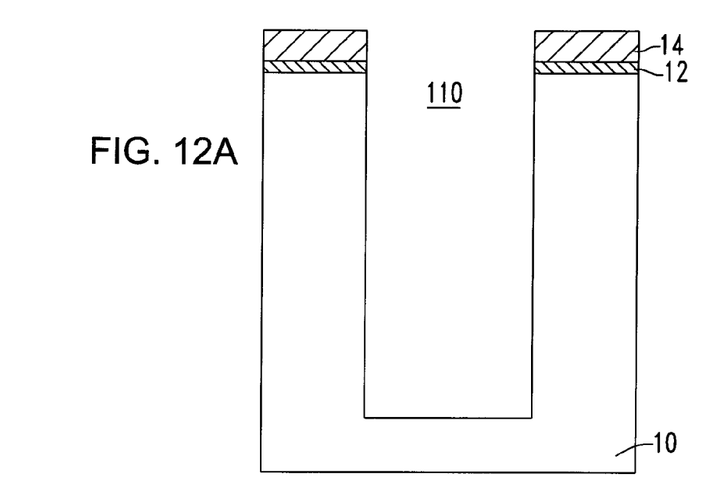
FIGS. 12–18 illustrate steps in a second method of practicing the invention.
Figure 12B:
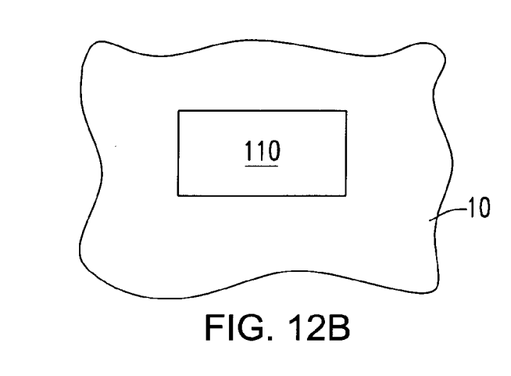

FIG. 12A shows the trench 110 after a step of etching down to the final trench depth in substrate 10. Elements of the drawing that are the same as in the previous embodiment will be denoted with the same numeral for convenience in exposition. Pad oxide 12 and pad nitride 14 are the same as in the previous version. FIG. 12B shows the basic trench cross section.

Figure 13:
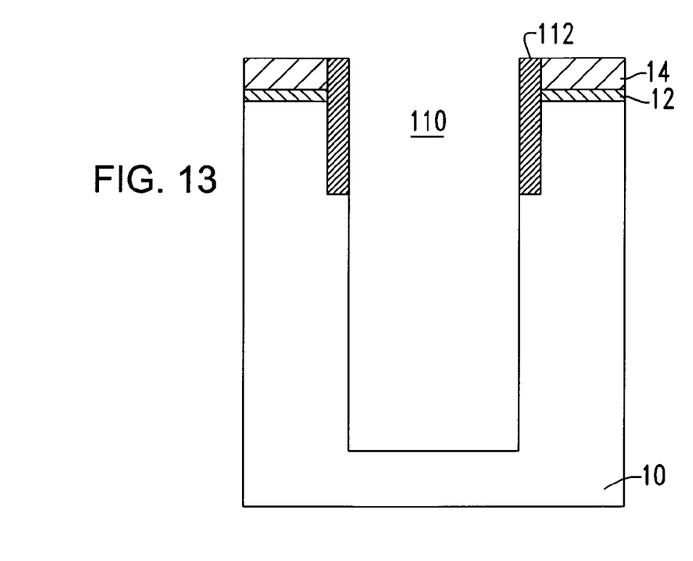

FIG. 13 shows the trench after formation of a collar 112 which is preferably a nitride layer. An oxide layer (not shown) may be optionally formed on trench sidewall before the nitride collar is formed to improve the adhesion of nitride and suppress the stress resulting from the direct contact of nitride on silicon. Any suitable methods in the art may be used to form the collar 112 on the upper trench walls. For example, the collar has been formed above a temporary poly fill that was deposited and recessed in a conventional step, and the poly is then removed from the trench.

Figure 14A:
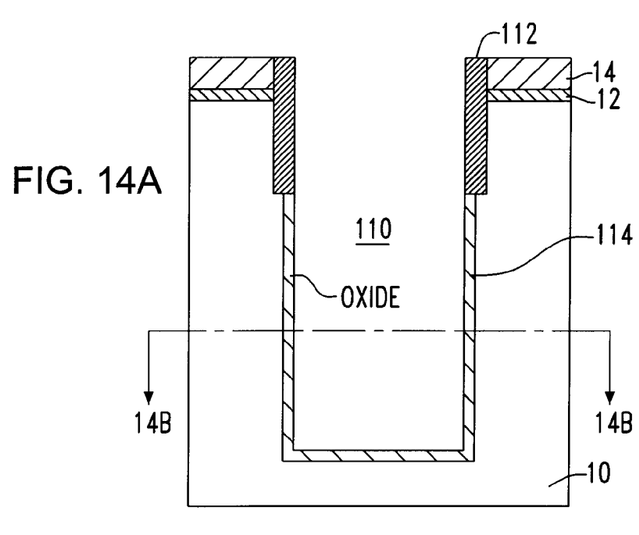
Figure 14B:
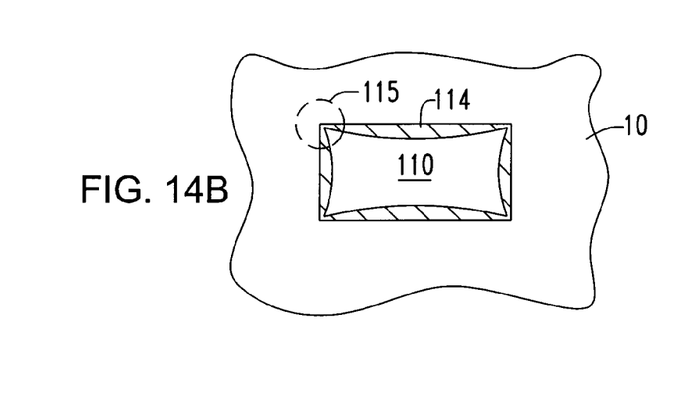

FIG. 14A shows the result of thermally oxidizing the silicon walls of aperture 110. FIG. 14B shows the same result as shown in FIG. 3B, with oxide 114 having a smaller thickness at corners 115.

Figure 15A:
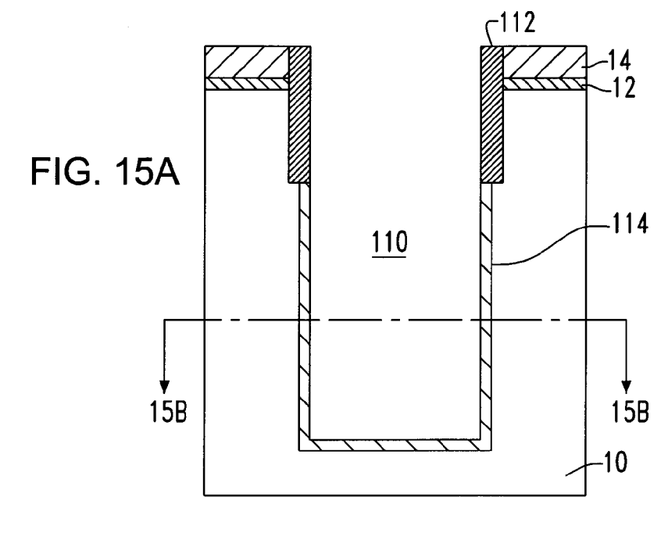

FIG. 15A shows the same view as FIG. 14A, since the nitride is formed in the corners after the oxide at the corners is removed and the cross section is taken through the center of the trench.

Figure 15B:
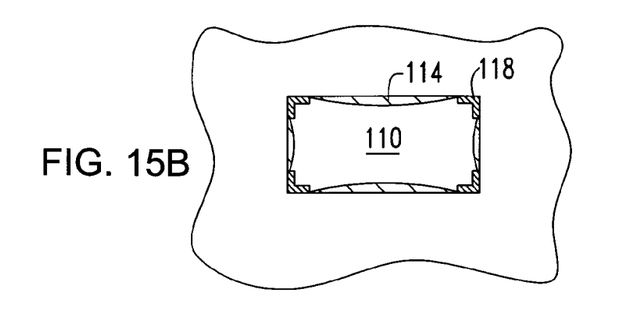

FIG. 15B is a counterpart to FIG. 5B, showing nitride 118 in the corners. The nitride 118 is preferably formed by thermal growth so that the nitride only formed at trench corners where silicon is exposed. No nitride is grown on trench walls as they are covered by oxide 114.

Figure 16A:
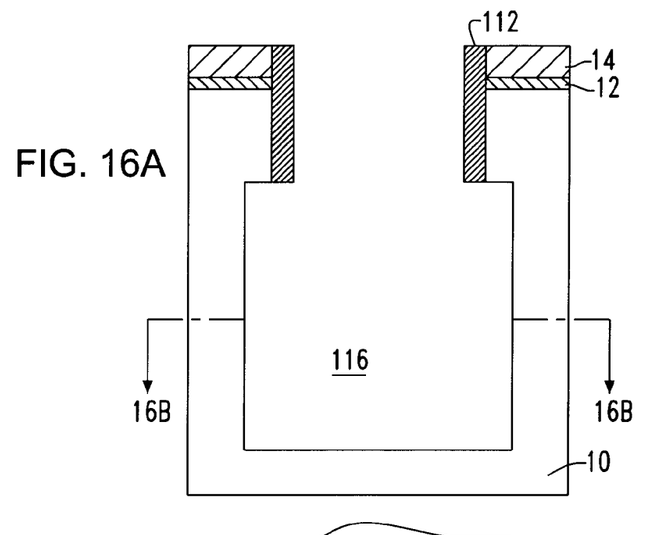
Figure 16B:
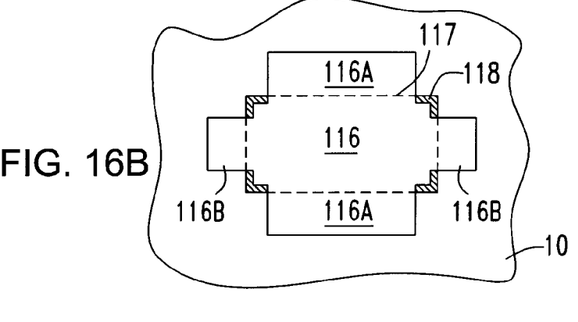

FIG. 16A shows the trench after the bottle etch step, with aperture 116 having the increased lateral dimensions. FIG. 16B is the counterpart to FIG. 7B, showing the overall aperture 116 with side apertures 16A and 116B producing by etching the central portions of the trench walls laterally.

Figure 17A:
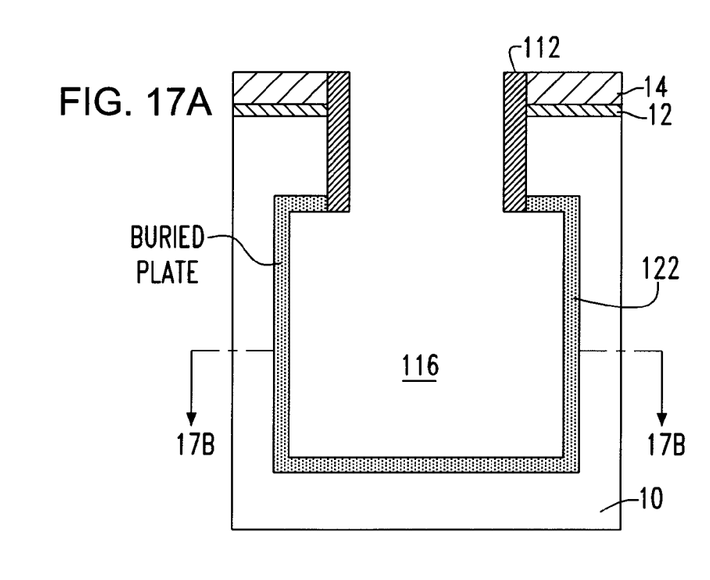
Figure 17B:
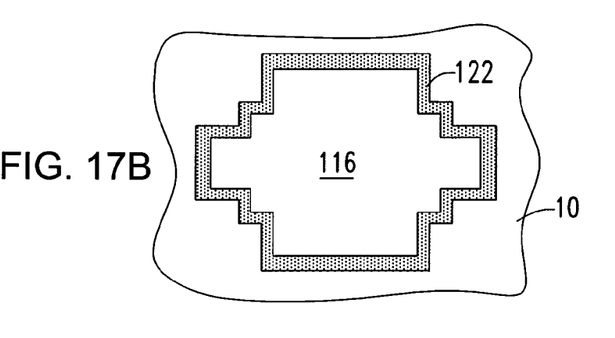

FIG. 17A shows the trench after formation of an optional buried plate 122. FIG. 17B is the counterpart to FIG. 8B, showing the polygon with its expanded perimeter.

Figure 18A:
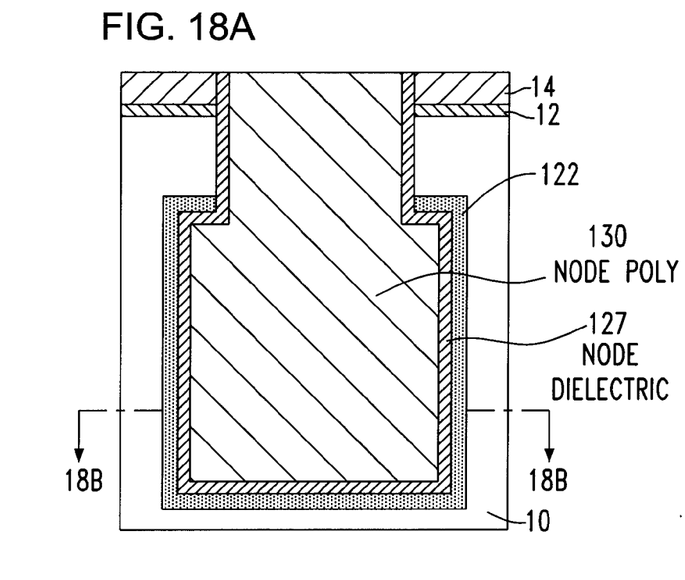
Figure 18B:
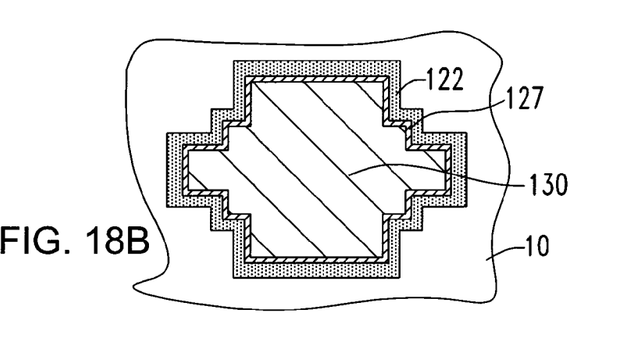

FIG. 18A shows the completed capacitor, with node dielectric 127 and center electrode 130. FIG. 18B is the counterpart to FIG. 10B, showing the increased capacitance provided by the expanded perimeter.

The process illustrated in this second embodiment may be summarized as:Forming pad oxide and pad nitride Depositing and patterning a hardmask such as oxide Etching a trench to its final depth Stripping the hardmask Forming a nitride collar Growing thermal oxide, thinner at the trench corners Etching oxide to expose silicon at trench corners, leaving oxide in the center Forming nitride in the corners Stripping remaining oxide Etching the exposed silicon in the center of trench walls Stripping nitride in the corners Forming buried plate (optional) Stripping collar Depositing node dielectric Filling the trench with center electrode Alternatively, the nitride in the corners may be stripped after forming the buried plate.

FIGS. 19–24 illustrate a third embodiment in which the nitride collar and the corner nitride are formed simultaneously.

Figure 19:
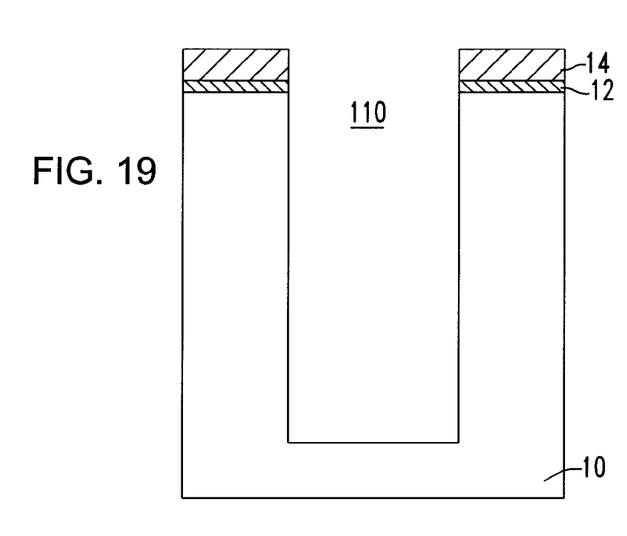
FIGS. 19–24 illustrate steps in a third method of practicing the invention.

FIG. 19 shows the result of etching the trench 110 to its final depth through pad oxide 12 and pad nitride 14. The hardmask 16 has been stripped after trench formation.

Figure 20A:
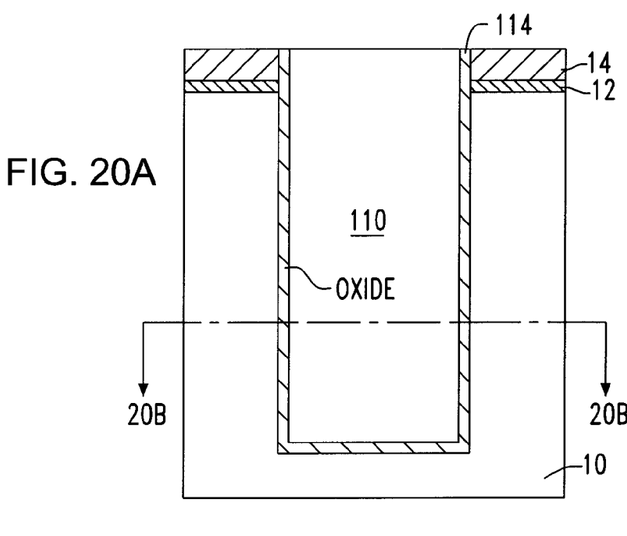
Figure 20B:
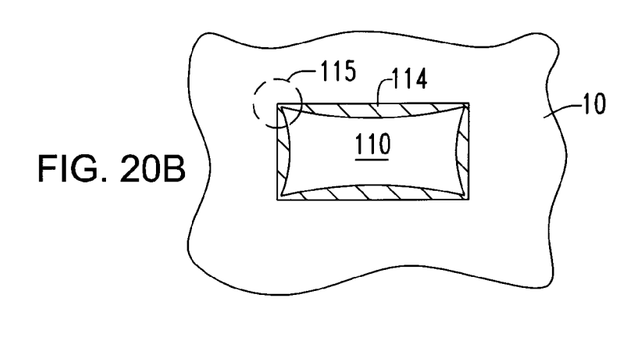

FIG. 20A shows the result of growing oxide 114 over the entire surface of the trench. FIG. 20B shows the result, with the thinner oxide in corners 115.

Figure 21:
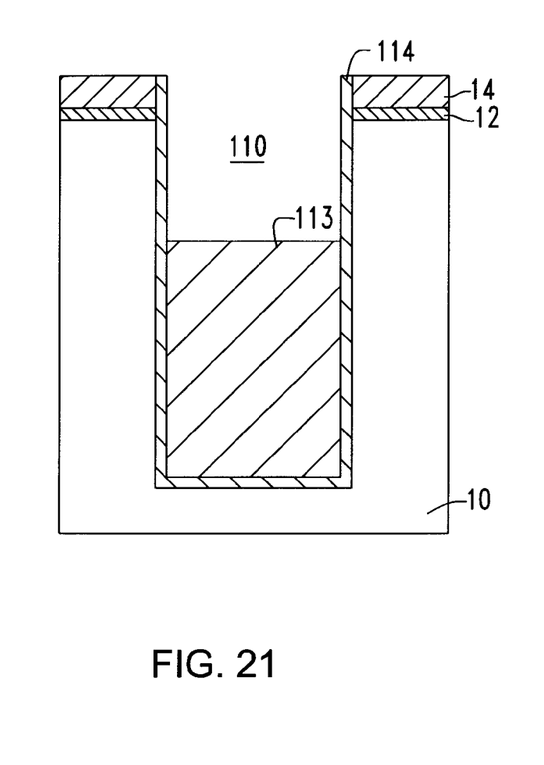

FIG. 21 shows the result of filling the trench with photoresist 113, then recessing it to the collar reference level.

Figure 22A:
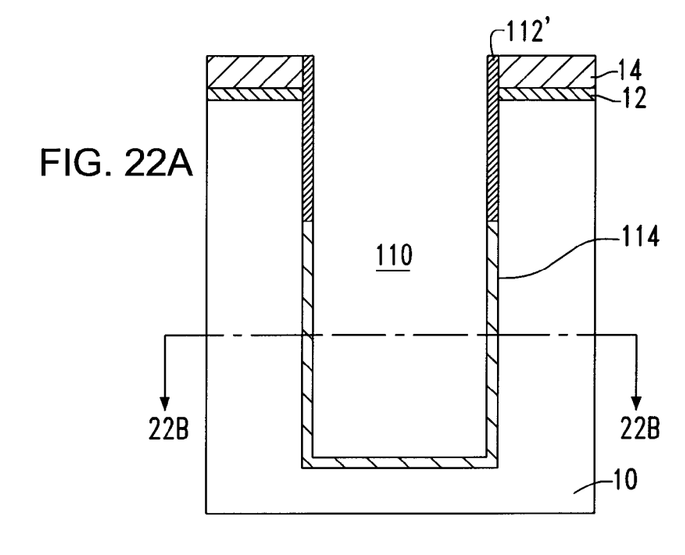

FIG. 22A shows the result of stripping oxide 114 above the level of resist 113, removing the resist, etching the oxide in the lower portion of the trench to expose silicon at the trench corners while keeping oxide in the center of trench walls, and then forming nitride collar 112' and nitride corners 118 simultaneously. The nitride is preferably formed by thermal growth so that the nitride is only formed on upper trench walls and at trench corners where silicon is exposed. No nitride is grown on lower trench walls as they are covered by oxide 114.

Figure 22B:
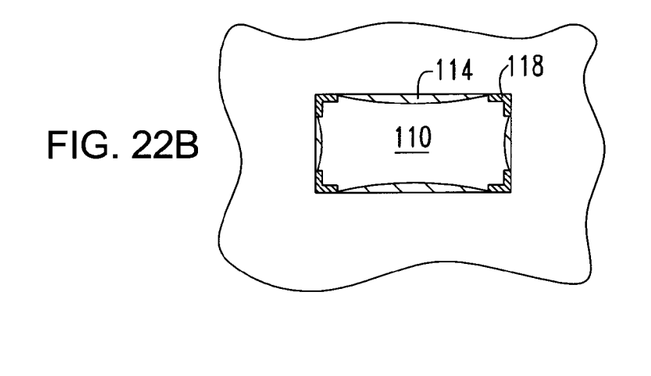

The advantage of this embodiment is that the collar 112' and the corner nitride 118 are formed in one step. FIG. 22B shows oxide 114 in the center of the lower trench walls and nitride 118 in the corners. The thickness of this nitride layer is not important, so long as it withstands the oxide etch and the bottle etch processes.

Figure 23A:
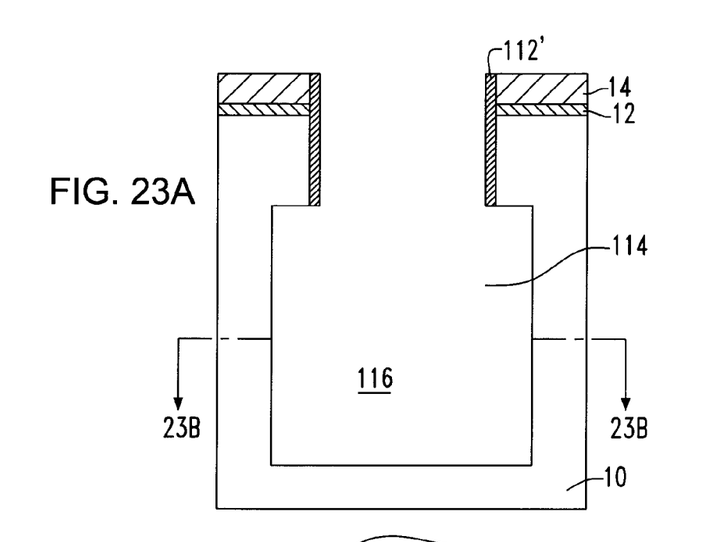

FIG. 23A shows the result of the bottle etch, with aperture 116 having an expanded cross section produced by side apertures 116A and 116B.

Figure 23B:
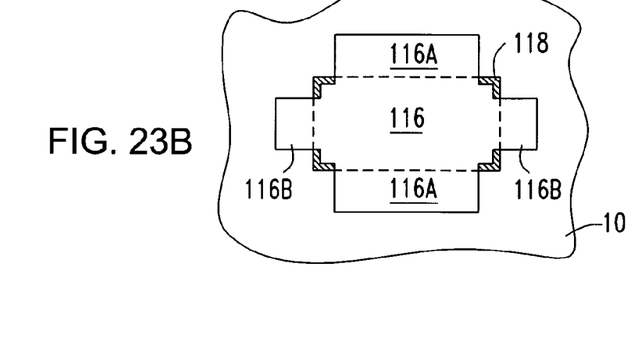

FIG. 23B shows the expanded aperture with the nitride remaining in the corners.

The buried plate 122 is optionally formed with the nitride 118 still in place in the corners. The presence of the nitride in the corners does not affect the formation of the buried plate because the dopant in the plate diffuses around it to form a continuous plate. The collar in the upper trench prevents the undesired doping in the upper trench. The nitride is then stripped from the top and bottom simultaneously after forming the buried plate 122.

Figure 24A:
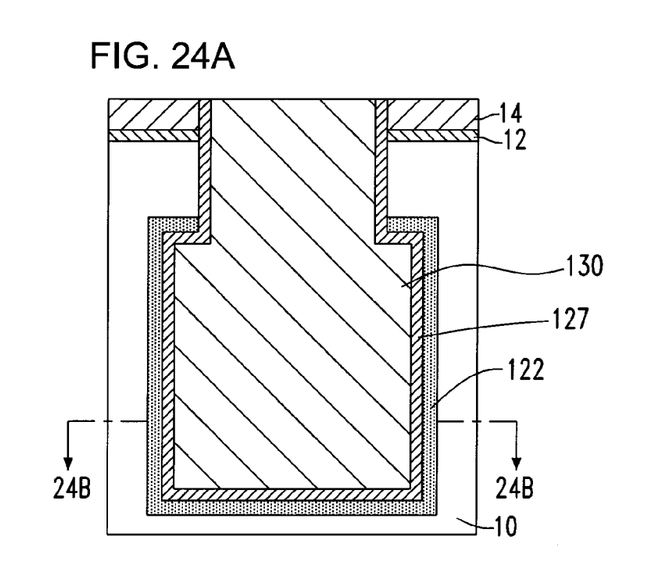
Figure 24B:
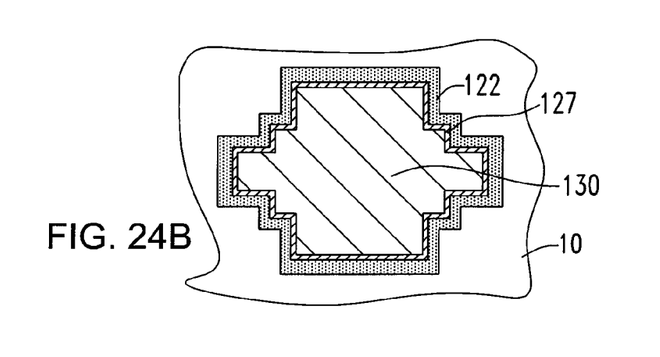

Finally, the node dielectric 127 and the center electrode 130 are formed, the result being shown in FIGS. 24A and 24B.

The process illustrated in this third embodiment may be summarized as:Forming pad oxide and pad nitride Depositing and patterning a hardmask such as oxide Etching a trench to its final depth Stripping the hardmask Growing thermal oxide, thinner at the trench corners Resist fill/resist recess Etching oxide above the resist Stripping the resist Etching oxide to expose silicon at trench corners, leaving oxide in the center Forming the nitride collar and nitride in the corners simultaneously Stripping remaining oxide Etching the exposed silicon in the center of trench walls Forming buried plate (optional) Stripping nitride collar and corner nitride simultaneously Forming node dielectric Filling the trench with center electrode While the invention has been described in terms of a single preferred embodiment, those skilled in the art will recognize that the invention can be practiced in various versions within the spirit and scope of the following claims.

The invention claimed is:

1. A trench structure formed in a semiconductor substrate comprising:
an upper portion of said trench having an upper polygonal cross section; a lower portion of said trench having a lower polygonal cross section comprising four straight main sides oriented with an angular difference between consecutive main sides; four inner projecting corners disposed between said four main sides, said four inner corners being located closer to a center of said polygonal cross section than said main sides; connecting lines connecting said inner corners with said main sides; and said lower polygonal cross section having a greater number of sides than said upper polygonal cross section.

2. A capacitor formed in a trench in a semiconductor substrate comprising:

an upper portion of said trench having an upper polygonal cross section; a lower portion of said trench having a lower polygonal cross section comprising four straight main sides oriented with an angular difference between consecutive main sides; four inner projecting corners disposed between said four main sides, said four inner corners being located closer to a center of said polygonal cross section than said main sides; and connecting lines connecting said inner corners with said main sides; said lower polygonal cross section having a greater number of sides than said upper polygonal cross section; a node dielectric disposed on interior surfaces of said lower portion of said trench; and a conductive center electrode disposed within said trench and abutting said node dielectric.

3. A capacitor according to claim 2, further comprising a transistor formed within said upper portion of said trench connected between said center electrode and a first cell contact, said transistor being controlled by a gate connected to a second cell contact, said capacitor and said transistor together thereby forming a DRAM cell.

* * * * *